(12) United States Patent
Munford

(10) Patent No.: US 6,888,065 B1
(45) Date of Patent: May 3, 2005

(54) EMI/RFI SHIELD FOR GAPS IN CASES OF ELECTRONIC SYSTEMS

(75) Inventor: Stefen Munford, Elk Point, SD (US)

(73) Assignee: Gateway, Inc., Irvine, CA (US)

( * ) Notice: Subject to any disclaimer, the term of this patent is extended or adjusted under 35 U.S.C. 154(b) by 0 days.

(21) Appl. No.: 10/810,043

(22) Filed: Mar. 26, 2004

(51) Int. Cl.$^7$ ................................................. H01H 9/02
(52) U.S. Cl. .................. 174/58; 174/35 R; 174/35 MS; 174/135; 361/818
(58) Field of Search .......................... 174/58, 51, 35 R, 174/35 MS, 35 GC, 135; 361/752, 753, 800, 816, 818; 257/94; 220/3.8, 4.02

(56) References Cited

U.S. PATENT DOCUMENTS

| | | | |
|---|---|---|---|
| 4,673,166 A | | 6/1987 | MacDougall |
| 5,774,337 A | * | 6/1998 | Lee et al. .................. 361/725 |
| 6,018,461 A | * | 1/2000 | Biermann et al. .......... 361/737 |
| 6,046,652 A | | 4/2000 | Deiso, III et al. |
| 6,147,299 A | | 11/2000 | Ferguson |
| 6,188,015 B1 | | 2/2001 | Curran, Sr. et al. |
| 6,271,465 B1 | | 8/2001 | Lacey |
| 6,272,022 B1 | | 8/2001 | Ferranti et al. |
| 6,377,449 B1 | | 4/2002 | Liao et al. |
| 6,411,522 B1 | * | 6/2002 | Frank et al. ................. 361/800 |
| 6,653,557 B2 | * | 11/2003 | Wolf et al. ............... 174/35 R |

* cited by examiner

*Primary Examiner*—Dhiru R. Patel
(74) *Attorney, Agent, or Firm*—Jeffrey A. Proehl; Leonard & Preehl

(57) ABSTRACT

An EMI/RFI shield for gaps in cases of electronic systems is disclosed that includes a case, a component mounted on the case, and a string positioned between the component and the case. The string includes a longitudinal element and a plurality of conductive filaments transversely mounted on the longitudinal element. The invention also contemplates a method of reducing radiation from a case housing at least one electronic component and having an opening formed therein with a perimeter. The method includes positioning a string having transverse conductive filaments along at least a portion of the perimeter of the opening, and installing the electronic component adjacent to the opening in the case with the string being positioned between the component and the case adjacent to the perimeter of the opening.

16 Claims, 5 Drawing Sheets

US 6,888,065 B1

EMI/RFI SHIELD FOR GAPS IN CASES OF ELECTRONIC SYSTEMS

FIELD OF THE INVENTION

The present invention relates to EMI/RFI shielding, and in particular to an EMI/RFI shield for shielding gaps in the cases of electronic systems against radiation leakage.

BACKGROUND OF THE INVENTION

In the electronics and computer industry today, cases which hold circuitry that create electromagnetic radiation are shielded to prevent emission of radiation referred to as EMI/RFI. Regulatory bodies set maximum emission levels at various frequencies. Devices failing emission level tests may not be sold. Electronic devices may also need to be shielded from electromagnetic radiation generated by devices outside their cases. In the personal computer (PC) industry, processor speeds are increasing. Electronic devices, such as PCs, must meet strict guidelines in the United States and other countries on the amount of radiation they produce within a given radius. With such high processor speeds, it is getting more and more difficult to ensure that PCs meet the radiation emission guidelines. In addition to the increasing frequency of operation, electronic devices must be manufactured in a cost effective manner to remain profitable.

Personal computers are frequently upgraded in function by users which may require taking apart the computer, adding circuitry, and putting the computer back together. To make this easier for a user to do, most PCs have panels which can be removed, and devices such as disk drives, CD and DVD players inserted into a cage. In some PCs, multiple such devices are staked vertically adjacent to each other. Such devices typically have a gap between them that is a source of EMI/RFI leakage. Additionally, PCs may include an aperture or opening in the case designed for exposing a portion of a single device or component that is positioned in or adjacent to an opening in the case, and a gap may be created between the perimeter of the opening and the outer surface of the device that can also become a source of EMI/RFI leakage. A way of preventing such leakage, while still permitting users to upgrade their systems, is needed.

Complex and costly solutions such as gluing an additional shield to cover gaps are too expensive, add additional parts which make the manufacturing process longer, are expensive, and prevent ease of upgrading by a user. Applying a conductive foam strip with adhesive backing on either the bottom surface of the top device surface, or on the top surface of the bottom device is also difficult for users to perform.

One solution is proposed in copending U.S. patent application Ser. No. 10/126,115, filed Apr. 19, 2002, which is assigned to the same assignee as the present application and the disclosure of which is incorporated by reference herein in its entirety. The Ser. No. 10/126,115 patent application describes situations in which a pair of adjacent devices in a case may create a gap therebetween, and a method and apparatus for closing that gap. However, the solution posed in the copending patent application may also find an application in situations where a single device or component is positioned adjacent to an opening in the case of a PC that may create a potential for EMI/RFI leakage in any gap formed along portions, or the entirety, of the perimeter of the opening in the case.

SUMMARY OF THE INVENTION

A string with conductive filaments is placed adjacent to an opening in a case for an electronic system, between the case and a component positioned on the case.

One aspect of the invention contemplates a system comprising a case, a component mounted on the case, and a string positioned between the component and the case. The string comprises a longitudinal element and a plurality of conductive filaments transversely mounted on the longitudinal element.

In some embodiments, the case defines an interior, and an opening is formed in the case between the interior and the exterior of the case, with the component being positioned adjacent to the opening and the string being positioned adjacent to the opening. The opening may have a perimeter with a length, and the string is positioned adjacent to at least a portion of the length of the perimeter of the opening. The component may be removably mounted on the case, and in some embodiments the case is configured so that the component is removable through the opening in the case, and in other embodiments the case configured so that the component is positionable adjacent to the opening in the case from the interior of the case.

Another aspect of the invention contemplates a method of reducing radiation from a case housing at least one electronic component and having an opening formed therein with a perimeter. The method comprises positioning a string having transverse conductive filaments along at least a portion of the perimeter of the opening, and installing the electronic component adjacent to the opening in the case with the string being positioned between the component and the case adjacent to the perimeter of the opening.

DETAILED DESCRIPTION OF THE INVENTION

In the following description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

The invention is contemplated for use in a system 10 which includes components and devices that have the potential to generate or create radiation that can lead to electromagnetic interference (EMI) or radio frequency interference (RFI) in other adjacent devices if not properly shielded.

Typically, the system includes a housing or case that functions to shield radiation generated by the circuits, components, and devices in the case from escaping the interior of the case and affecting devices external to the case. In most applications, the case includes a number of openings to facilitate access to components but may degrade the shielding function of the case.

Figure 1:
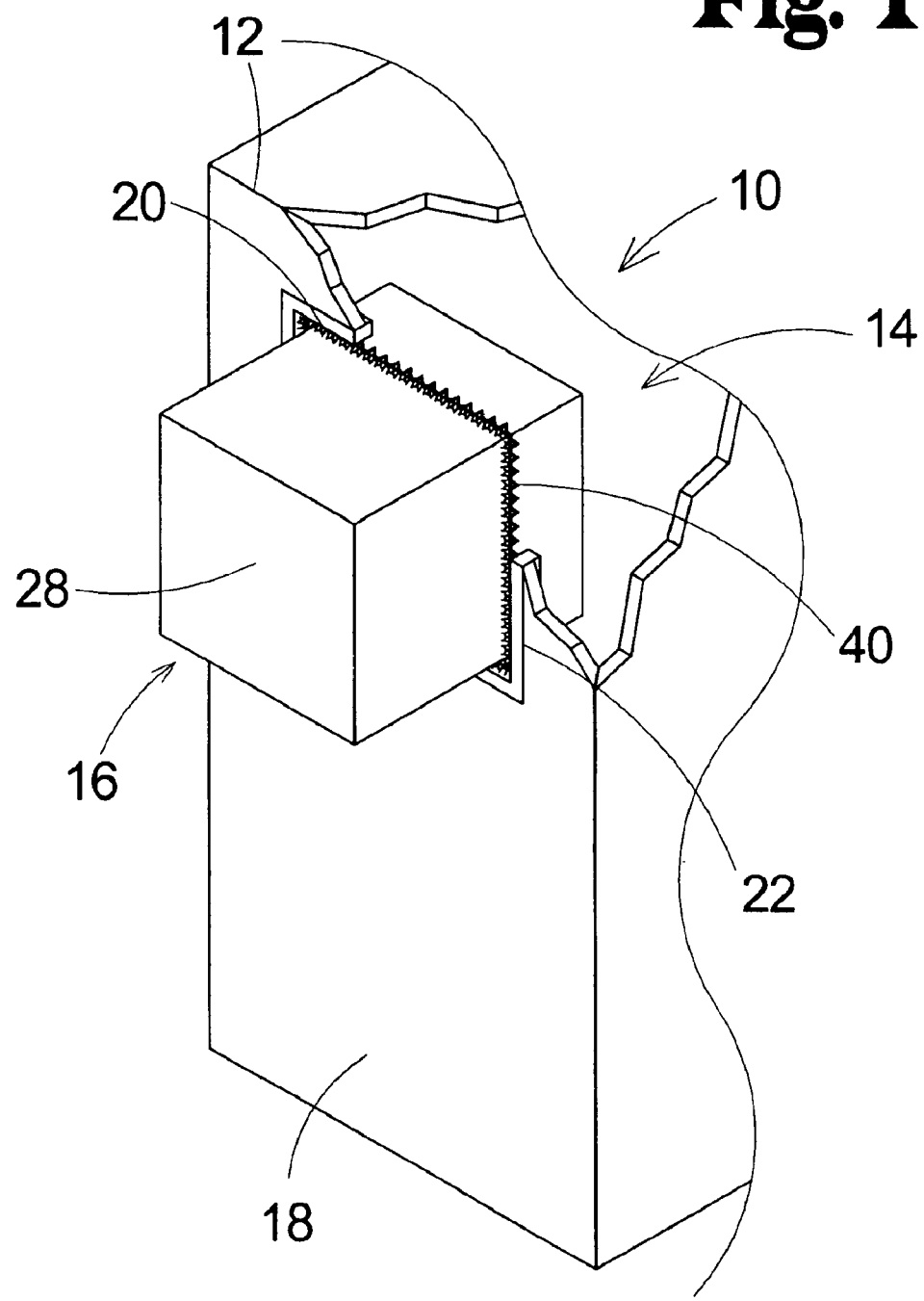
FIG. 1 is a schematic perspective view of a case with a component partially inserted through an opening in the case about which a string of the present invention is positioned.
Figure 2:
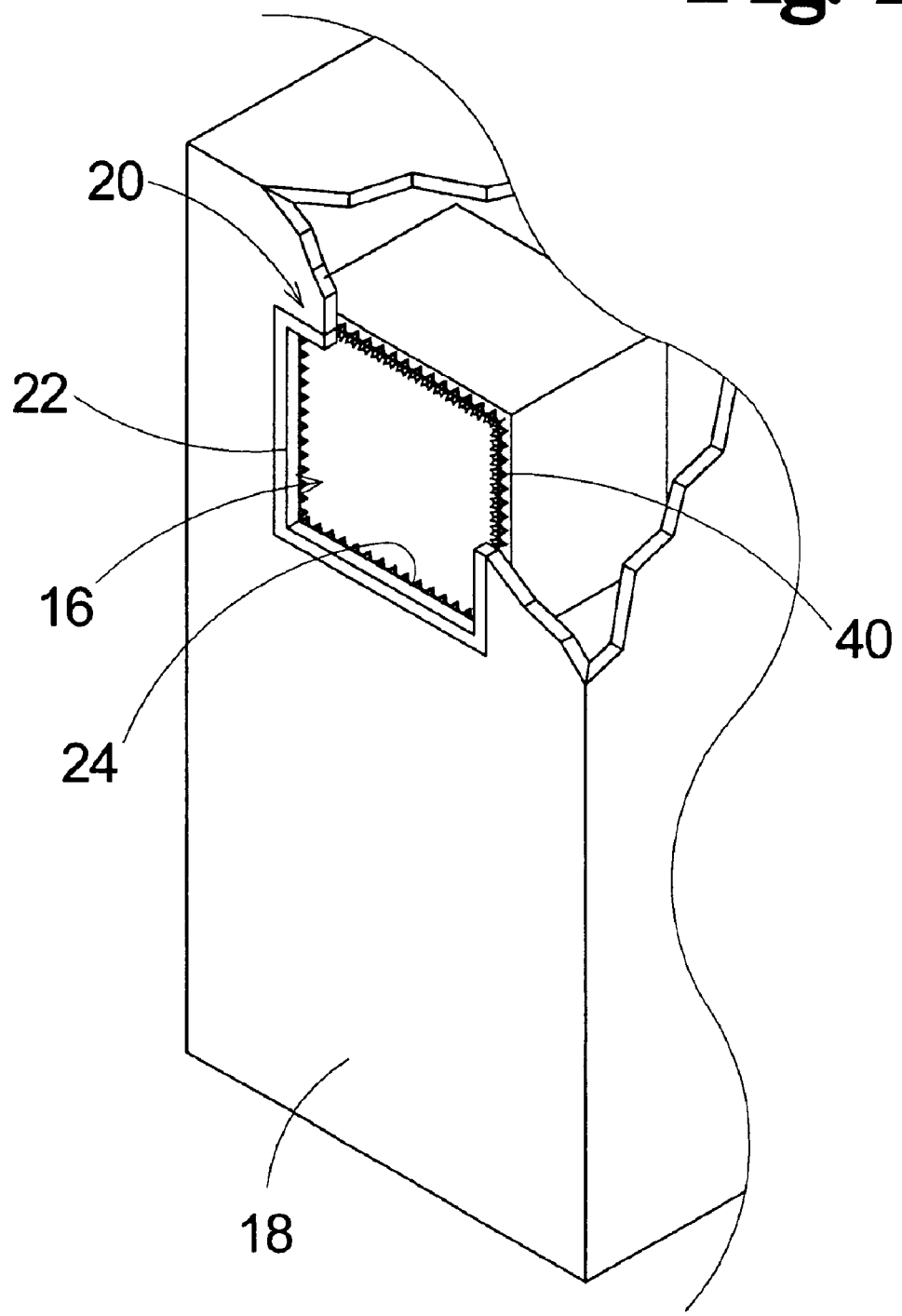
FIG. 2 is a schematic perspective view of a component positioned adjacent to an opening in the case with a string of the invention positioned between the component and the case.

In greater detail, as seen in FIGS. 1 and 2, the system 10 may comprise a personal computer or other electronic device, and includes a case 12 which generally defines an interior 14 for holding and supporting the components 16 and devices making up the system. The case 12 may be formed at least partially of a conductive material, such as sheet metal, to perform the electronic shielding function. The case 12 may have at least one opening 20 that is formed in the case and extends between the interior 14 of the case and an exterior 18 of the case. Optionally, the opening 20 may be created by the removal of a panel from the case 12, such as an access panel. The opening 20 in the case 12 has a perimeter 22 that defines the bounds of that opening. In some cases, the perimeter 22 of the opening 20 may be formed by an edge 24 of the material forming the case 12, such as an edge formed by a cut in the sheet metal of the case (see FIG. 4). In other cases, the perimeter 22 of the opening 20 may be formed by a flange 26 of material created, for example, by bending a portion of the material inward from the exterior 18 of the case 12 (see FIG. 3). Often, but not necessarily, the perimeter 22 of the opening 20 is substantially rectangular in shape, although the invention may also be applied in conjunction with openings having perimeters that are circular, regular or irregular (or a combination thereof) in shape.

Figure 3:
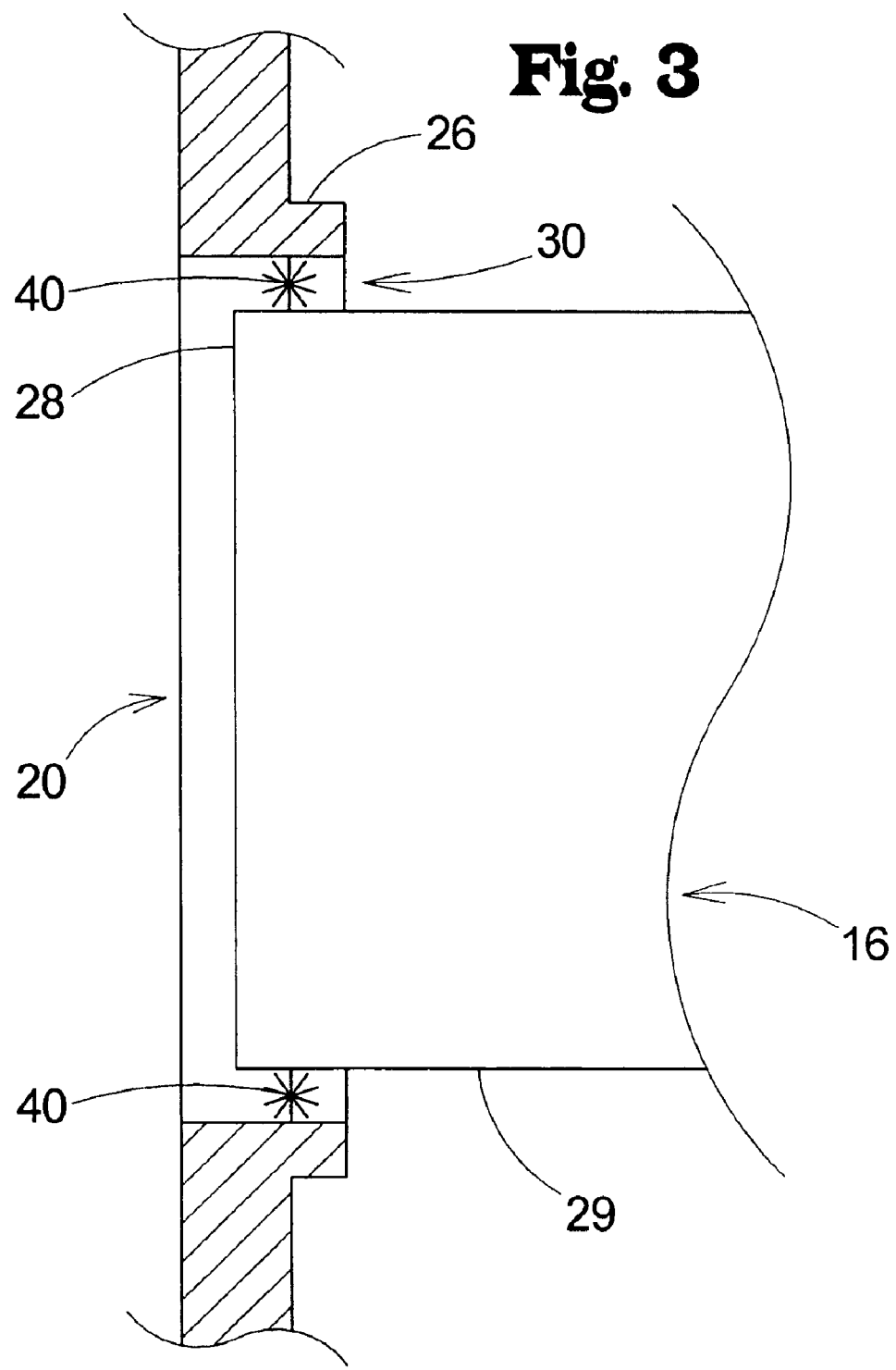
FIG. 3 is a schematic sectional view of the component and case of FIG. 1 shown with the component fully inserted in the case and the string being positioned between the component and case.
Figure 4:
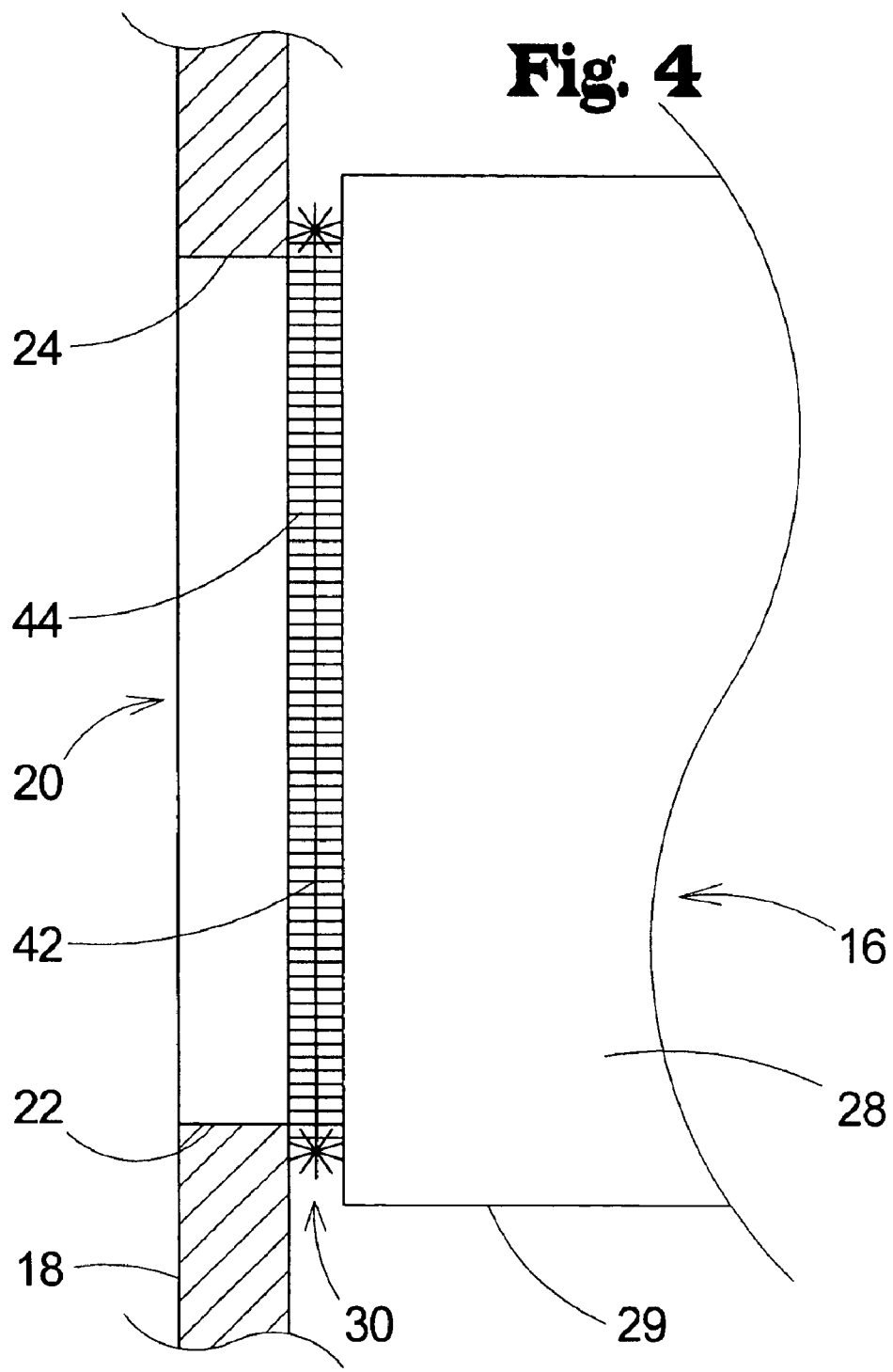
FIG. 4 is a schematic sectional view of the component and case of FIG. 2 with the string positioned therebetween.

As shown in FIGS. 1 and 3, at least one component 16 of the system 10 is located at least partially in the interior 14 of the case 12 and is located in the opening 20, or as shown in FIGS. 2 and 4, at least adjacent to the opening 20 in the case 12. The component 16 typically has a housing 28 with an outer surface 29. The component 16 may be removably mounted on the case 12, or may be more permanently mounted on the case 12, but may produce an aperture or gap 30 between the component 16 and the perimeter 22 of the opening 20 at some portion or portions of the opening where the case 12 does not contact the housing 28 of the component 16. The gap 30 or gaps between the perimeter 22 of the opening in the case and the housing 28 of the component present an opportunity for radiation from the component or other components in inside the case 12 to escape from the interior 14 of the case when the system 10 is operating.

In some embodiments of the invention, the component 16 when installed may partially extend into or through the opening 20 (see FIG. 3), and in other embodiments, the component 16 is substantially completely positioned in the interior 14 of the case 12, with a portion of the component 16, such as the front face or bezel of the component, being positioned adjacent to the opening 20 (see FIG. 4). However, it will be recognized that other parts or portions of the housing 28 of the component 16 may be exposed on the exterior 18 of the case 12.

In some embodiments of the invention, the component 16 comprises a power supply for a computer system contained in the case 12. The power supply of a computer system is typically removable from the case 12 of the system to permit replacement of the power supply for the purposes of repair or upgrading. The power supply component 16 is often positioned adjacent to an opening 20 in the case 12 to permit air to flow from the exterior 18 of the case 12 into apertures or slots formed in the outer surface 29 of the housing 28 of the power supply component 16. The power supply component 16 often houses a cooling fan to induce the air flow through the housing 28 of the power supply component and the case 12 of the computer system 10. In some applications, the power supply component 16 may be removable from the interior 14 of the case 12 through the opening 20 (see FIG. 1), and in other applications the power supply component 16 may be positioned adjacent to the opening 20 but is removed and replaced through the interior 14 of the case 12 (see FIG. 2), such as after removal of an access cover panel from the case 12.

A significant aspect of the invention is a string 40 that is positioned between the component 16 and at least a portion of the case 12 adjacent to the perimeter 22 of the opening 20. In some embodiments, the string 40 may be positioned between an entirety of the perimeter 22 of the opening 20 and the component 16, and in other embodiments of the invention, the string 40 may be positioned between only a partial portion of the perimeter 22 of the opening 20 and the component 16. Illustratively, in the case of the opening 20 with a substantially rectangular-shaped perimeter 24, the string 40 of the invention may be positioned between only one or two or three sides or segments of the substantially rectangular-shaped perimeter 24 and the component 16, rather than all four sides of the complete perimeter 22.

In greater detail, the string 40 may include a longitudinal element 42 extending a length of the string 40 and a plurality of conductive filaments 44 that are mounted on the longitudinal element 42 and extend transversely with respect to the longitudinal length of the string. The conductive filaments 44 are thus able to form a conductive path between the case 12 adjacent to a portion of the perimeter 22 of the opening 20 and the housing 28 of the component 16 when the ends of the filaments 44 touch or contact both the case 12 at the opening 20 and the housing 28 of the component 16, which in many cases is also shielded.

In some embodiments of the string 40, the longitudinal element 42 may be conductive, so that both the longitudinal element 42 and the filaments 44 are both conductive. In such embodiment, the longitudinal element 42 may optionally comprise two or more twisted conductive fibers such as copper or other conductive metal conducive to twisting. In other embodiments of the string 40, the longitudinal element 42 may be non-conductive while the filaments 44 transversely mounted on the longitudinal element 42 are conductive. In some embodiments, at least portion of the longitudinal element 42 may be elastic.

The conductive filaments 44 may be inserted between the twisted fibers of the longitudinal element 42 in one embodiment, such that their orientation is transverse, or substantially perpendicular, to the length of the twisted fibers of the longitudinal element 42. The string 40 may look similar to a test tube cleaning brush in some embodiments. At least some of the filaments 44 sufficiently follow a line drawn between the component 16 and the case 12 at the perimeter 22 of the opening 20 such that both ends of such filaments 44 contact the case 12 and the component 16. Other filaments 44 may form an angle from such line in a random or repetitive fashion. In some embodiments, a substantial number of the filaments 44 of the string 40 are positioned substantially in line with the line drawn between the case 12 and the component 16. Such alignment may be substantially perpendicular to the surface of the case 12 at the opening 20 and the outer surface 29 of the housing 28 of the component 16, or at least aligned to contact both. The alignment may be controlled during the twisting process in a known manner. The number of filaments 44 required in such a string 40 is less than when the filaments 44 are randomly oriented.

The string 40 may have a loop (not shown) formed on one or both ends of the string 40 that is designed for coupling to a hook formed on the case 12 of the housing 28 of the component 16. Various other connection schemes such as knots in each end of the string 40, and mating V-shaped openings in flanges on the case are also within the scope of the invention. Optionally the string 40 may be formed into a loop that may be looped about the housing of the component.

The conductive filaments 44 should be of sufficient length to contact the case 12 and the component 16. The spacing of the filaments 44 may be varied as desired. In one embodiment, the spacing is dependent on the frequency of the radiation generated within the personal computer. The conductive filaments 44 may be randomly oriented with respect to the longitudinal element 42 of the string 40 in some embodiments, and may be consistently oriented within a desired range of angles with respect to the longitudinal element 42 in other embodiments. In still further embodiments, the string 40 has multiple wire brushes to ensure consistent contact with the case 12 and the component 16.

It will be appreciated that an opening 20 may be provided in the case 12 for a grouping of more than one component 16, and the string 40 of the invention may be positioned between the opening 20 in the case 12 and the grouping of components 16, or even a cage holding and supporting the grouping of components 16, as disclosed in U.S. patent application Ser. No. 10/126,115. As also disclosed in the referenced patent application, a string 40 may be positioned between the components 16 of the grouping to close any gaps between the components 16 that might permit radiation leakage from the case 12. It will also be appreciated that the string 40 of the invention may be employed in the interior 14 of the case 12 of a system in conjunction with shielding structures and the like which may be employed internally to shield one component of the system from radiation generated by other components of the system.

Generally, the components and devices, collectively referred to herein as components, most suitable for use with the invention are those that are positioned in or adjacent to an opening 20 in the case 12 to thereby expose some aspect or portion of the component 16 to the exterior 18 of the case 12. The opening 20 in the case 12 may be provided for installing and removing the component 16 or device, for inserting and removing removable media, or for other reasons. More specifically, the devices may comprise drives for removable media such as floppy disks, tapes, CD-ROMs, music CDs, recordable CDs, DVDs, recordable DVDs, and drives for more permanent media such as hard disk drives, and the like. These components may also include housings or cages for holding a power supply and/or cooling fan, removable PC circuit cards (ISA, PCI, etc.), and other components that have some aspect or portion that is positioned in or exposed through an opening in the case of the system.

The invention finds the greatest benefit with components 16 and devices that are periodically removed and reinstalled or replaced, and in which a gap or gaps between the housing of the components or devices must be electrically closed to the escape of radiation therethrough each time that the component or device is replaced in the case. In these situations, the use of a more permanent barrier to the escape of electronic radiation may not be practical as it may be destroyed upon removal of the component or device, or may not be as effective when the component of device is reinstalled in the case.

Figure 5:
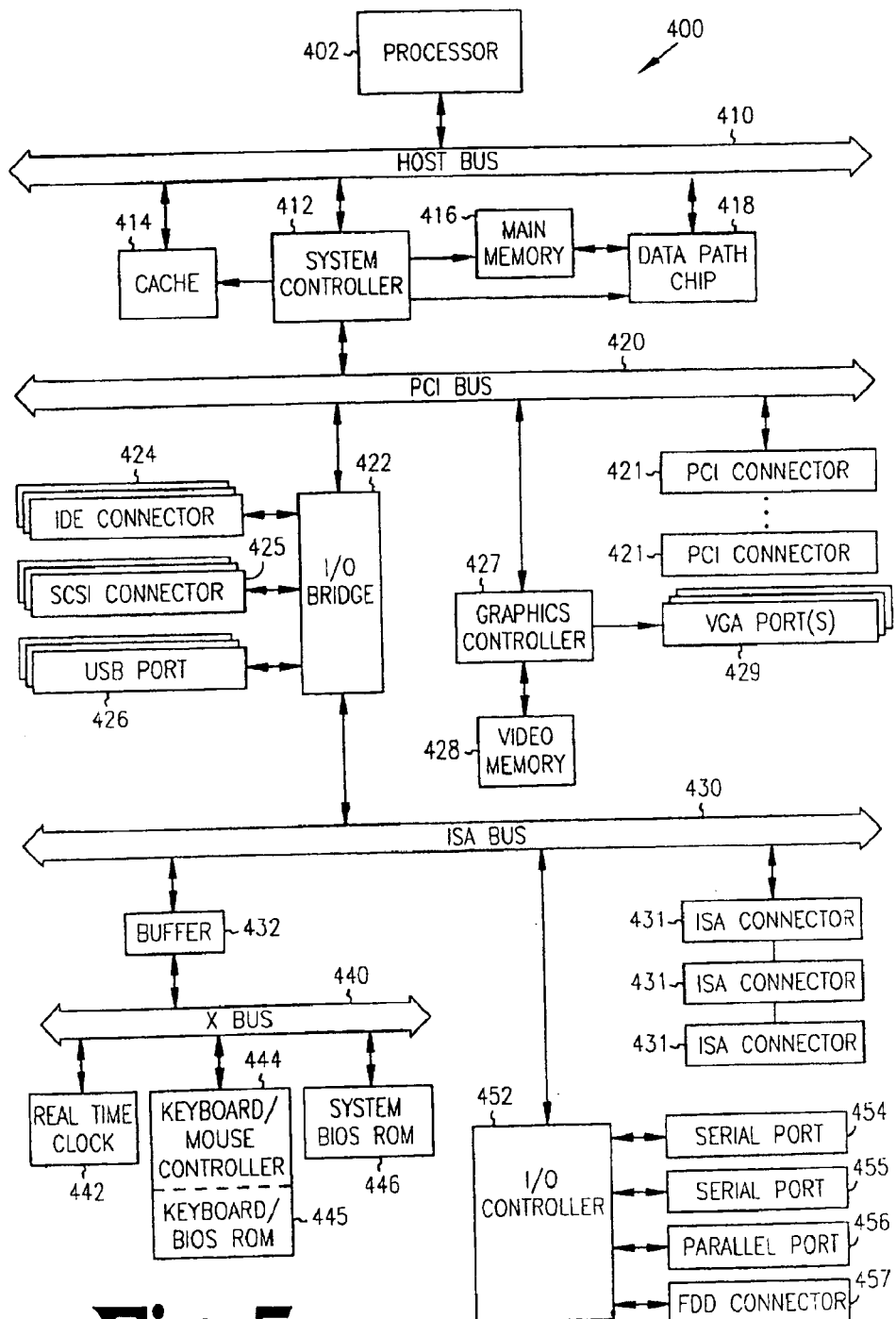
FIG. 5 is a detailed architectural block diagram of the computer system utilizing the current invention.

A computer system 400 that generates EMI/RFI radiation which must be blocked in accordance with regulations, and thus suitable for use with the invention, is shown in FIG. 5 in a block diagram format. Computer system 400 in one embodiment is a personal computer. Computer system 400 is housed in a sheet metal or other type of rigid radiation blocking material.

Computer system 400 comprises a processor 402, a system controller 412, a cache 414, and a data-path chip 418, each coupled to a host bus 410. Processor 402 is a microprocessor such as a 486-type chip, a Pentium®, Pentium® II, Pentium® III, Pentium® 4, or other suitable microprocessor. Cache 414 provides high-speed local-memory data (in one embodiment, for example, 512 KB of data) for processor 402, and is controlled by system controller 412, which loads cache 414 with data that is expected to be used soon after the data is placed in cache 414 (i.e., in the near future). Main memory 416 is coupled between system controller 412 and data-path chip 418, and in one embodiment, provides random-access memory of between 16 MB and 256 MB or more of data. In one embodiment, main memory 416 is provided on SIMMs (Single In-line Memory Modules), while in another embodiment, main memory 416 is provided on DIMMs (Dual In-line Memory Modules), each of which plugs into suitable sockets provided on a motherboard holding many of the other components shown in FIG. 4. Main memory 416 includes standard DRAM (Dynamic Random-Access Memory), EDO (Extended Data Out) DRAM, SDRAM (Synchronous DRAM), or other suitable memory technology. System controller 412 controls PCI (Peripheral Component Interconnect) bus 420, a local bus for system 400 that provides a high-speed data path between processor 402 and various peripheral devices, such as graphics devices, storage drives, network cabling, etc. Data-path chip 418 is also controlled by system controller 412 to assist in routing data between main memory 416, host bus 410, and PCI bus 420.

In one embodiment, PCI bus 420 provides a 32-bit-wide data path that runs at 33 MHz. In another embodiment, PCI bus 420 provides a 64 bit-wide data path that runs at 33 MHz. In yet other embodiments, PCI bus 420 provides 32-bit-wide or 64-bit-wide data paths that run at higher speeds. In one embodiment, PCI bus 420 provides connectivity to I/O bridge 422, graphics controller 427, and one or more PCI connectors 421 (i.e., sockets into which a card edge may be inserted), each of which accepts a standard PCI card. In one embodiment, I/O bridge 422 and graphics controller 427 are each integrated on the motherboard along with system controller 412, in order to avoid a board-connector-board signal-crossing interface and thus provide better speed and reliability. In the embodiment shown, graphics controller 427 is coupled to a video memory 428 (that includes memory such as DRAM, EDO DRAM, SDRAM, or VRAM (Video Random-Access Memory)), and drives VGA (Video Graphics Adaptor) port 429. VGA port 429 can connect to industry-standard monitors such as VGA-type, SVGA (Super VGA)-type, XGA-type (extended Graphics Adaptor) or SXGA-type (Super XGA) display devices.

In one embodiment, graphics controller 127 provides for sampling video signals in order to provide digital values for pixels. Autophase correction is provided by monitoring synchronization pulses and polarities, and looking up new phase corrections corresponding to the changes. In further embodiments, the video signal is provided via a VGA port 129 to an analog LCD display. The LCD display performs the monitoring, sampling and autophase adjustment as further described with respect to FIGS. 2 and 3.

Other input/output (I/O) cards having a PCI interface can be plugged into PCI connectors 421. Network connections providing video input are also represented by PCI connectors 421, and include Ethernet devices and cable modems for coupling to a high speed Ethernet network or cable network which is further coupled to the Internet.

In one embodiment, I/O bridge 422 is a chip that provides connection and control to one or more independent IDE or SCSI connectors 424–425, to a USB (Universal Serial Bus) port 426, and to ISA (Industry Standard Architecture) bus 430. In this embodiment, IDE connector 424 provides connectivity for up to two standard IDE-type devices such as hard disk drives, CDROM (Compact Disk-Read-Only Memory) drives, DVD (Digital Video Disk) drives, videocassette recorders, or TBU (Tape-Backup Unit) devices. Such devices are either installed at manufacturing time, or may be installed by a user by removal of a panel. The devices may be supported by cage like structure, which is insertable into the computer system, or may be directly supported by similar cage like supports built directly into the computer housing.

In one similar embodiment, two IDE connectors 424 are provided, and each provide the EIDE (Enhanced IDE) architecture. In the embodiment shown, SCSI (Small Computer System Interface) connector 425 provides connectivity for up to seven or fifteen SCSI-type devices (depending on the version of SCSI supported by the embodiment). In one embodiment, I/O bridge 422 provides ISA bus 430 having one or more ISA connectors 431 (in one embodiment, three connectors are provided). In one embodiment, ISA bus 430 is coupled to I/O controller 452, which in turn provides connections to two serial ports 454 and 455, parallel port 456, and FDD (Floppy-Disk Drive) connector 457. At least one serial port is coupled to a modem for connection to a telephone system providing Internet access through an Internet service provider. In one embodiment, ISA bus 430 is connected to buffer 432, which is connected to X bus 440, which provides connections to real-time clock 442, keyboard/mouse controller 444 and keyboard BIOS ROM (Basic Input/Output System Read-Only Memory) 445, and to system BIOS ROM 446.

Installation of components or devices into the case involves using the string of conductive fibers either prior to or after insertion of the component into the case or mounting of the component on the case.

In one embodiment, the string, and conductive filaments thereon, block emissions of EMI/RFI in accordance with regulations. The string provides an easy way to both manufacture modular electronic devices, and also to upgrade them in the field by a user. The user is provided with a kit in one embodiment, including instructions, the multi-filament string, and a device to install. The string interferes very little with installation of the drive, as the filaments are flexible. The string biases the filaments against both the case adjacent the opening and the housing of the component when installed to provide multiple conductive paths therebetween along the length of the string.

I claim:

1. A system comprising:

a case;

a component mounted on the case; and a string positioned between the component and the case, the string comprising a longitudinal element and a plurality of conductive filaments transversely mounted on the longitudinal element.

2. The system of claim 1 wherein at least a portion of the plurality of the conductive filaments of the string contact the case and the component.

3. The system of claim 1 wherein the case defines an interior, an opening being formed in the case between the interior of the case and an exterior of the case.

4. The system of claim 3 wherein the component is positioned adjacent to the opening in the case, and the string is positioned adjacent to the opening.

5. The system of claim 3 wherein the opening has a perimeter with a length, the string being positioned adjacent to at least a portion of the length of the perimeter of the opening.

6. The system of claim 3 wherein the perimeter of the opening is substantially rectangular with sides, the string being positioned adjacent to at least one of the sides of the perimeter of the opening in the case.

7. The system of claim 3 wherein the component is located in the interior of the case.

8. The system of claim 1 wherein the component comprises a power supply.

9. The system of claim 1 wherein the component comprises a drive.

10. The system of claim 1 wherein the component is removably mounted on the case.

11. The system of claim 10 wherein the case is configured so that the component is removable through the opening in the case.

12. The system of claim 10 wherein the case configured so that the component is positionable adjacent to the opening in the case from the interior of the case.

13. The system of claim 1 wherein the component generates radiation when the component is operating.

14. A method of reducing radiation from a case housing at least one electronic component and having an opening formed therein with a perimeter, the method comprising:

positioning a string having transverse conductive filaments along at least a portion of the perimeter of the opening; and installing the electronic, component adjacent to the opening in the case with the string being positioned between the component and the case adjacent to the perimeter of the opening.

15. The method of claim 14 wherein the step of installing the component is performed after the step of positioning the string.

16. The method of claim 14 wherein the step of installing the component comprises inserting the component through the opening in the case.

* * * * *